(12) United States Patent
Allen et al.

(10) Patent No.: US 7,354,867 B2
(45) Date of Patent: Apr. 8, 2008

(54) ETCH PROCESS FOR IMPROVING YIELD OF DIELECTRIC CONTACTS ON NICKEL SILICIDES

(75) Inventors: Scott D. Allen, Legewood, NJ (US); Kenneth A. Bandy, Red Hook, NY (US); Sadanand V. Deshpande, LeGrangeville, NY (US); Richard Wise, New Windsor, NY (US)

(73) Assignee: International Business Machines Corporation, Armonk, NY (US)

( * ) Notice: Subject to any disclaimer, the term of this patent is extended or adjusted under 35 U.S.C. 154(b) by 65 days.

(21) Appl. No.: 10/906,112

(22) Filed: Feb. 3, 2005

(65) Prior Publication Data
US 2006/0172535 A1    Aug. 3, 2006

(51) Int. Cl.
*H01L 21/44* (2006.01)
*H01L 21/461* (2006.01)

(52) U.S. Cl. ............... 438/738; 638/682; 638/724; 638/744; 257/E21.252; 257/E21.577

(58) Field of Classification Search ............ 438/724, 438/738, 744, 682
See application file for complete search history.

(56) References Cited

U.S. PATENT DOCUMENTS

| | | | |
|---|---|---|---|
| 6,107,208 A * | 8/2000 | Cheng et al. ............ 438/724 |
| 6,150,270 A * | 11/2000 | Matsuda et al. .......... 438/687 |
| 6,277,700 B1 | 8/2001 | Yu et al. |
| 6,461,529 B1 * | 10/2002 | Boyd et al. ............... 216/67 |
| 6,699,795 B1 | 3/2004 | Schwarz et al. |
| 6,756,313 B2 | 6/2004 | Choi et al. |

\* cited by examiner

*Primary Examiner*—Alexander G. Ghyka
(74) *Attorney, Agent, or Firm*—Joseph Petrokaitis; Greenblum & Bernstein, P.L.C.

(57) ABSTRACT

The embodiments of the invention generally relate to an etching process, and more particularly to an etch processing for improving the yield of dielectric contacts on nickel silicides. An oxygen-free feedgas is used in an etching process to reduce or eliminate residuals, including oxidation and consumption of the silicide layer, at the contact surface. The contact resistance at contact surface is reduced, thereby improving the performance of the device.

13 Claims, 3 Drawing Sheets

ETCH PROCESS FOR IMPROVING YIELD OF DIELECTRIC CONTACTS ON NICKEL SILICIDES

FIELD OF THE INVENTION

The embodiments of the invention generally relate to an etching process, and more particularly to an etch processing for improving the yield of dielectric contacts on nickel silicides.

BACKGROUND OF THE INVENTION

Patterning of insulators in modern semiconductor technology, especially for so-called "middle of the line" or MOL levels, may require the use of barrier or "stop" layers because of the presence of underlying topography. The barrier layer is substantially different than the isolation dielectric material above it, and therefore, by design, requires a separate etching step in the patterning process which has selectivity to the underlying materials.

One such MOL level requires that the barrier, typically silicon nitride, be etched over a silicide. It may be desirable for device performance reasons for the silicide layer to be made of a nickel silicide (NiSi), as opposed to a cobalt silicide (CoSi). These materials have different physical and chemical properties and the etching chemistry for the barrier layer must be chosen properly to avoid consuming excessive amounts of the silicide during the process. Also, the amount of residuals left behind and the surface damage must be minimized, so that the surface of the underlying silicide is suitable for further processing.

Conventional barrier etch processes have been shown to consume too much of the NiSi and deposit excessive amounts of polymer, especially on devices such as arsenic doped n-FETs. In order to prevent excessive deposition of polymer and consequent etch stop, an oxygen feedgas is added to the barrier etch chemistry. Although the use of oxygen is adequate for cobalt based silicides, a thick residual film are often formed in the contacts when the oxygen feedgas is used with nickel silicides. These residuals are resistant to standard dry clean steps used in plasma etching (e.g., oxygen), and are less prevalent in tooling with an inherently lower self-bias voltage. These residuals may be formed by carbonyls of nickel and subsequent delamination into the contact. The exact mechanism is not clearly understood, nor is the reason why n-FETs, especially arsenic doped n-FETs, are most likely affected.

MOL contact etch typically requires a high self-bias process for the oxide step for both profile control and throughput. One possible solution to the formation of residuals has been to run the barrier etch in a different tool. This solution is designed to etch the barrier layer but is often not well suited to etching the thick isolation dielectric. For example, for silicon nitride, a spacer type etch tool may be used, which has a very low inherent self-bias, and therefore allows higher inherent selectivity to silicides than that possible on a standard oxide etch tool. If no Ni is eroded, then the postulated Ni carbonyl formation cannot occur. However, this de-integrated approach increases the cycle time of the MOL etch, produces an increased risk of defects, and requires additional tooling.

SUMMARY OF THE INVENTION

In view of the foregoing, an exemplary embodiment of the invention provides a method for etching a semiconductor wafer comprising the steps of forming a substrate, forming a silicide layer on the substrate, forming an insulation layer on the silicide layer, forming an oxygen-free feed gas, and etching the insulation layer to expose at least one portion of the silicide layer.

A further exemplary embodiment of the invention provides a method for etching a semiconductor wafer includes the steps of forming a substrate, forming a silicide layer on the substrate, and forming a dielectric layer on the silicide layer. The method further includes forming a feed gas, where the feed gas consists essentially of nitrogen, etching the dielectric layer to expose at least one portion of the silicide layer and forming a contact material on the dielectric material such that the contact material contacts at least one exposed portion of the silicide layer.

A further exemplary embodiment of the invention provides a semiconductor wafer including a substrate, and a silicide layer on the substrate. The semiconductor wafer further includes an insulation material on the silicide layer having exposed portions to the silicide layer wherein the exposed portions are etched using an oxygen-free feed gas and are substantially free of a residual layer, and a contact material layer on the insulation material such that the contact material layer is in contact at least one exposed portion of the silicide layer.

BRIEF DESCRIPTION OF THE DRAWINGS

The above and other features and advantages of the invention will become more apparent to those of ordinary skill in the art by describing in detail exemplary embodiments thereof with reference to the attached drawings.

DETAILED DESCRIPTION OF EMBODIMENTS OF THE INVENTION

Figure 1:
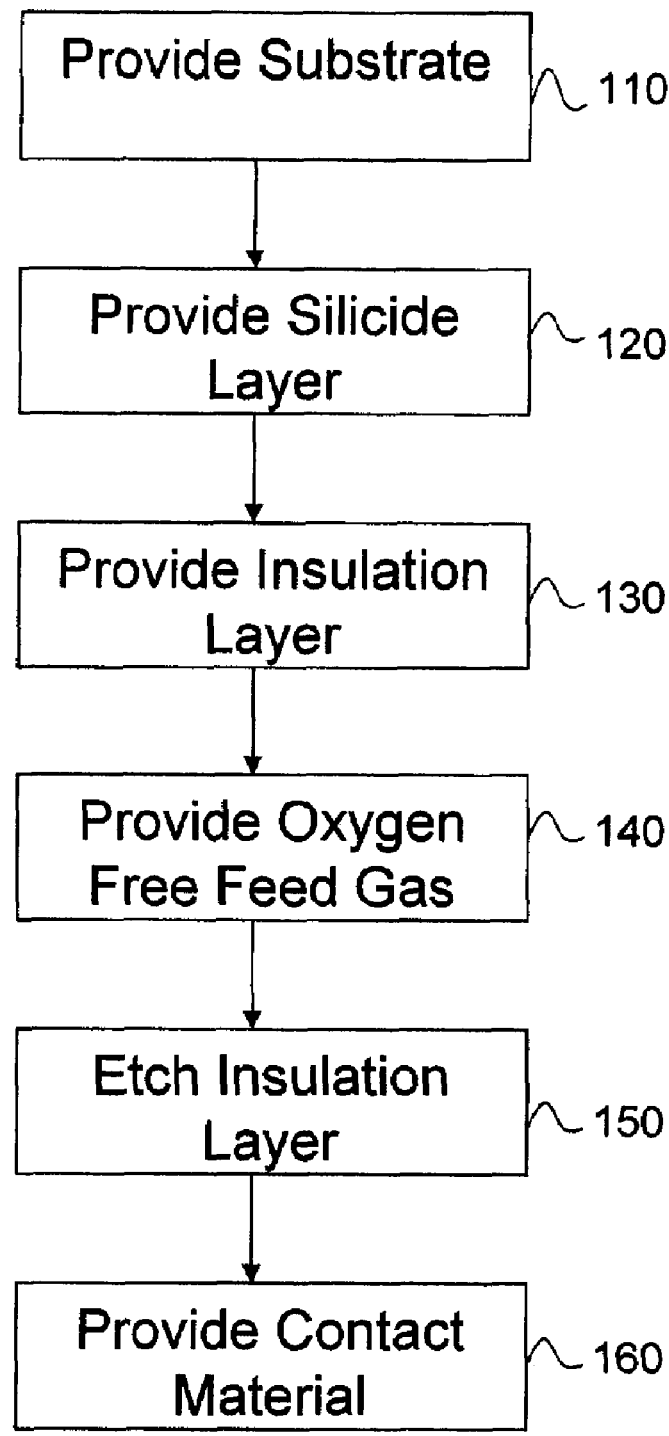
FIG. 1 is a flowchart illustrating a method for etching a semiconductor wafer according to an embodiment of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

According to an embodiment of the invention, a nitride etch chemistry is based on nitrogen addition, rather than oxygen, with improved selectivity to nickel silicide and substantial mitigation of residuals on the nickel silicide. This replacement may prevent the carbonyl formation of Ni, and hence any residuals. In particular, even with moderate consumption of the nickel silicide in this novel chemistry, the significant formation of residuals is reduced or eliminated, allowing the use of the oxide etch tool and subsequent integration of the etch process without opens.

FIG. 1 is a flowchart illustrating a process for etching a semiconductor wafer according to an embodiment of the invention. At step 110, a substrate is provided. At step 120, a silicide layer is provided, and at step 130, an insulation layer is provided. According to an embodiment of the invention, the silicide layer may be a metal silicide, such as nickel silicide. According to a further embodiment of the invention, the insulation layer may comprise a dielectric material, such as silicon nitride, silicon dioxide, silicon oxynitride, silicon carbide, or other dielectric film.

At step 140, an oxygen-free feedgas is provided, and etching of the insulation layer occurs at step 150. According to an embodiment of the invention, the oxygen-free feedgas consists substantially of nitrogen. The etching is performed, with the oxygen-free feedgas, such that the silicide layer is exposed, but that consumption of the silicide layer is reduced or eliminated. Contact material is provided at step 160. The contact material may provide an electrical connection to the silicide layer. According to an embodiment of the invention, the various layers may be provided directly on a subsequent layer. For example, the silicide layer may be provided directly on the substrate. However, it is understood that one or more other materials may be placed in between the substrate and the silicide layer.

Typical etch chemistries contain $CF_4$, $CH_2F_2$, Ar and $O_2$, though others may be used to achieve better selectivity to the insulator. As described above, the presence of oxygen gas ($O_2$) in the feedgas of this process allows for the production of carbonyl groups (C—O) which are known to create volatile nickel carbonyls ($Ni(CO)_4$). By elimination of the $O_2$ from the feedgas, thereby providing an oxygen-free feedgas, the pathway for the chemical attack of the nickel silicide (NiSi) by this mechanism may be reduced or eliminated. In addition, other gases having oxygen, (i.e., carbon dioxide ($CO_2$, etc.) may be eliminated to remove sources of oxygen. This may also be referred to as an atomic oxygen free feed gas. According to an embodiment of the invention, other oxygen sources may be found in the etching chamber, either from parts of the tool or from the insulator itself. However, these oxygen sources may be of a much smaller degree than direct injection in the feedgas.

Figure 2:
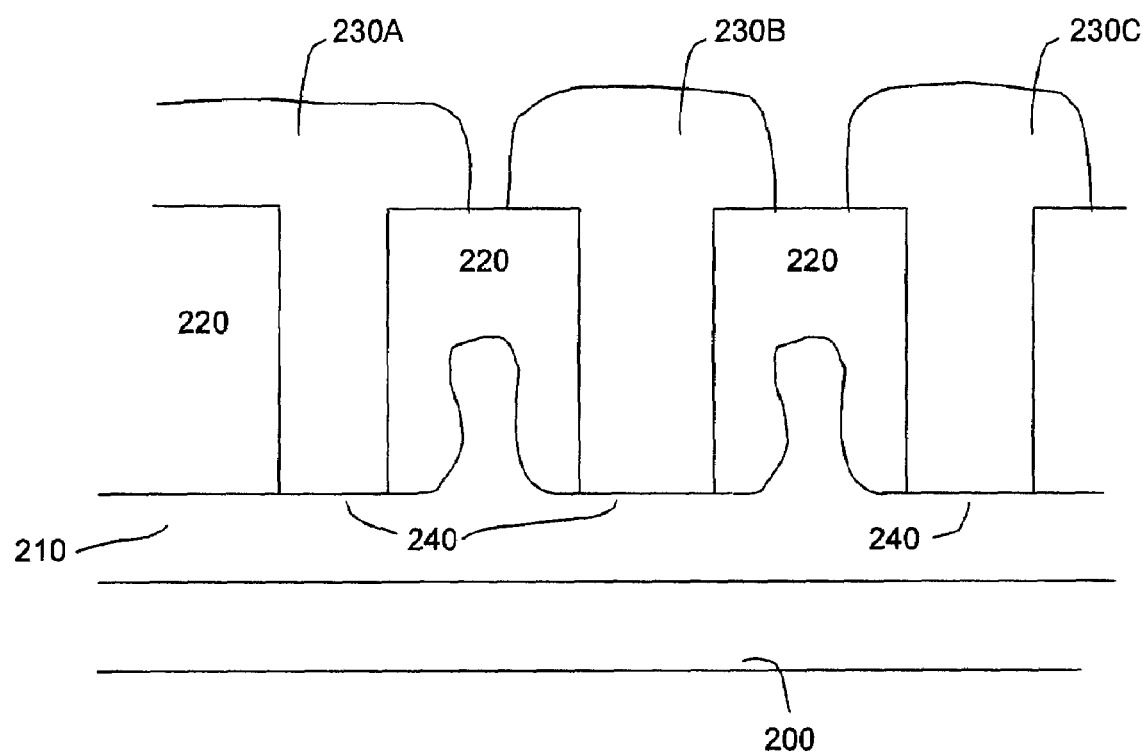
FIG. 2 is a cross-section representation of a semiconductor wafer etched according to an embodiment of the invention.

FIG. 2 is a cross-section representation of a semi-conductor wafer etched according to an embodiment of the present invention. A silicide layer 210 is located on a substrate 200. An insulation layer 220 is located on the silicide layer 210. As illustrated, the insulation layer has been etched to the silicide layer 210 to form contact surfaces 240. According to an embodiment of the invention, the insulation layer 220 is etched to the silicide layer 210 to form the contact surfaces, but the etching reduces or eliminates the consumption of the silicide. Further, oxidation is reduced or eliminated at the contact surfaces 240.

A first contact material 230A, a second contact material 230B, and a third contact material 230C are shown provided in the areas etched in the insulation layer 220. The first contact material 230A, a second contact material 230B, and a third contact material 230C comprise an electrically conductive material that provides an electrical contact with the silicide layer 210 at the respective contact surface 240. While the first contact material 230A, the second contact material 230B, and the third contact material 230C have been illustrated in FIG. 2 as being separate, distinct and not connected, it is understood that the same contact material can be provided to connect two or more contact surfaces 240 of the silicide layer 210. The first contact material 230A, the second contact material 230B, and the third contact material 230C may be any type of contact material, such as, for example, copper.

Figures 3A, 3B:
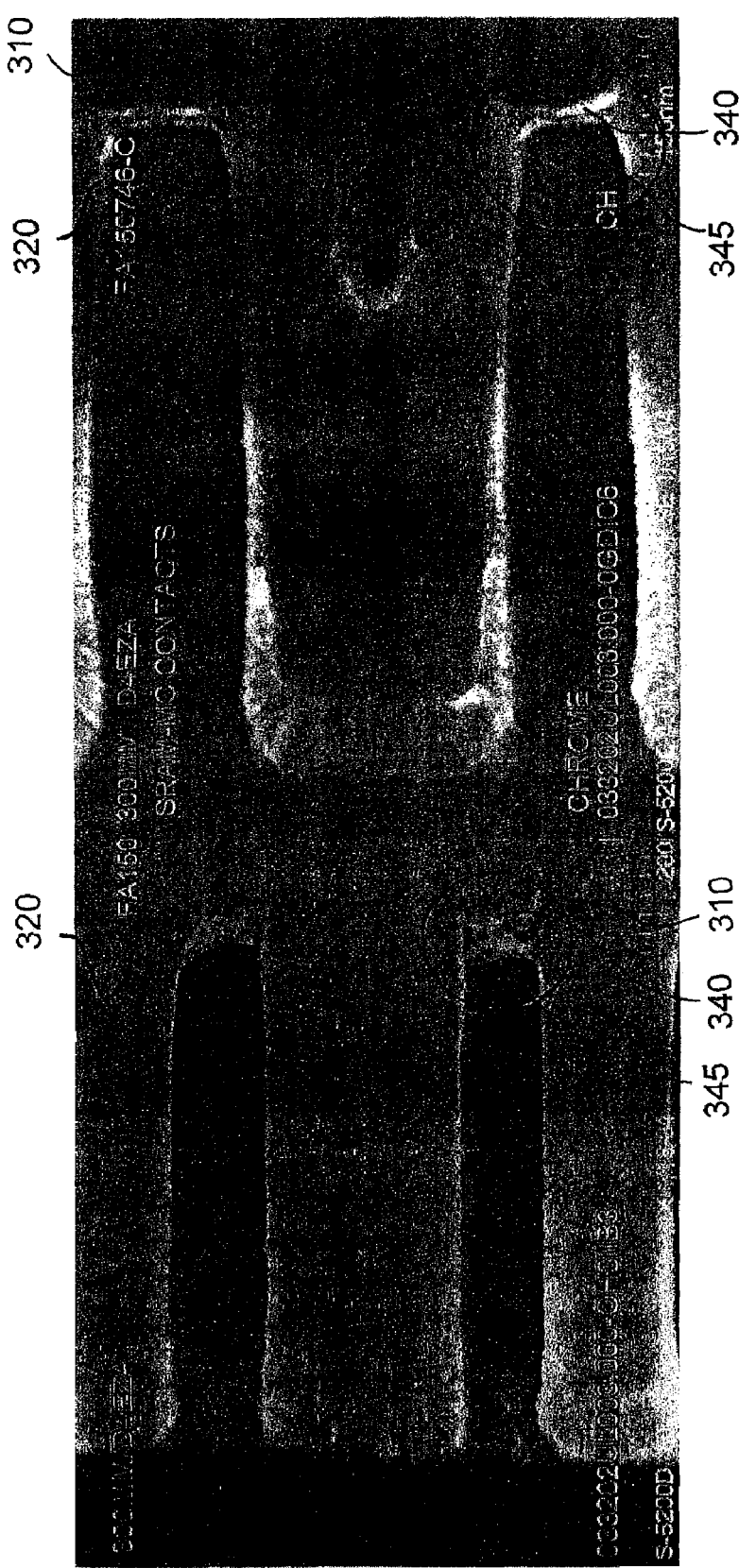
FIG. 3A is a cross-sectional SEM image of a semiconductor wafer etched through a conventional process.
FIG. 3B is a cross-sectional SEM image of two semiconductor wafers etched through a process of an embodiment of the invention.

FIG. 3A is a cross-sectional image of a semiconductor wafer etched through a conventional process and FIG. 3B is a cross-sectional SEM image of two semiconductor wafers etched through a process of an embodiment of the invention. The difference between these figures shows the results of the substitution of an oxygen-free feedgas as described above.

As illustrated in FIG. 3A, a dielectric 320 is etched to the silicide layer 310. A contact surface 340 of the silicide layer 310 has residuals 345 in the etched portion of the dielectric layer 320. The residuals 345 may be oxidation and/or the results of consumption of the silicide layer 310. Using conventional processes, the metal in the silicide is oxidized. The silicide, which may contain nickel or other metal, may also be consumed. The resulting oxide layer blocks conductivity.

FIG. 3B also illustrates a dielectric 320 etched to the silicide layer 310. However, at a contact surface 340 of the silicide layer 310, there are little or no residuals 345 in the etched portion of the dielectric layer 320. Thus, the contact surface 340 of the silicide layer 310 has a better electrical connection for a contact material (not shown) that will be provide on the dielectric layer 320. This is provided by using the oxygen-free feed gas since the residuals, which may include oxidation and/or the consumption of the silicide layer, may be reduced or eliminated.

According to an embodiment of the invention, manufacturing a semiconductor device includes etching a dielectric material and stopping at a conducting layer, such as a silicide-type layer, which may include some sort of metal layer. These processes use different feed gases in a high energy environment to etch away the dielectric layer and stop on the silicide layer. It is desirable to stop on the layer without damaging the layer or removing any portion of the layer. Typical conventional type processes or chemistries often result in an oxidation on the silicate layer, as well as damage induced. By using an oxygen-free feed gas, such as hydrogen or nitrogen, damage and/or oxidation may be reduced or eliminated in the silicide layer. According to an embodiment of the invention, a hydrogen-based feed gas may range from about 0% to about 80% hydrogen by volume, and more specifically about 5% to about 15% hydrogen and more by volume. The remaining volume may include other gases, such as argon or fluorocarbons. According to another embodiment of the invention, a nitrogen-based feed gas may range from about 0% to about 80% nitrogen by volume, and more specifically, about 25% to about 45% nitrogen by volume. The remaining volume may include other gases, such as argon or fluorocarbons.

According to an embodiment of the invention, an oxygen-free feedgas is provided for the etching process. The feedgas may consist substantially of nitrogen. Alternatively, the feedgas may comprise a hydrogen-based feedgas. Other oxygen-free feedgases may also be used.

The use of the oxygen-free feedgas according to an embodiment of the invention improves the self-bias on the semiconductor wafer during the plasma etching process. According to an embodiment of the invention, the etching tool may result in a self-bias to the wafer of greater than about 50 volts, and, more particularly, in a self-bias to the wafer of greater than about 300 volts.

While the invention has been described in terms of exemplary embodiments, those skilled in the art will recognize that the invention can be practiced with modifications and in the spirit and scope of the appended claims.

What is claimed is:

1. A method of etching a semiconductor wafer comprising the steps of:
    forming a substrate;
    forming a nickel silicide layer on the substrate;
    forming an insulation layer comprising silicon nitride on the nickel silicide layer;
    forming an oxygen free feed gas; and
    etching the insulation layer to expose at least one portion of the nickel silicide layer.

2. The method of claim 1, further comprising forming a contact material on the insulating material such that the contact material contacts at least one exposed portion of the nickel silicide layer.

3. The method of claim 1, wherein the feed gas comprises nitrogen in a range of about 0% to about 80% by volume.

4. The method of claim 1, wherein the feed gas comprises nitrogen in a range of about 25% to about 45% by volume.

5. The method of claim 1, wherein the feed gas comprises hydrogen in a range of about 0% to about 80% by volume.

6. The method of claim 1, wherein the feed gas comprises hydrogen in a range of about 5% to about 15% by volume.

7. The method of claim 2, further comprising the step of forming a second contact material layer on the insulation layer such that the second contact material layer is in contact with at least another of the exposed portion of the nickel silicide layer.

8. The method of claim 1, wherein there is no significant formation of residuals at the at least one exposed portion of the nickel silicide layer.

9. The method of claim 1, wherein the step of etching results in a self-bias to the wafer of greater than about 50 volts.

10. The method of claim 1, wherein the step of etching results in a self-bias to the wafer of greater than about 300 volts.

11. The method for etching a semiconductor wafer comprising the steps of:
    forming a substrate;
    forming a silicide layer on the substrate;
    forming a dielectric layer on the silicide layer;
    forming a feed gas, where the feed gas consists essentially of nitrogen;
    etching the dielectric layer to expose at least one portion of the silicide layer; and
    forming a contact material on the dielectric material such that the contact material contacts at least one exposed portion of the silicide layer wherein the silicide layer comprises a nickel silicide.

12. The method of claim 11, wherein the dielectric layer comprises silicon nitride.

13. The method of claim 11, wherein there is no significant formation of residuals at the at least one exposed portion of the silicide layer.

* * * * *